(12) United States Patent
Roy

(10) Patent No.: US 7,791,956 B2
(45) Date of Patent: Sep. 7, 2010

(54) METHOD AND SYSTEM FOR SIMULTANEOUS READS OF MULTIPLE ARRAYS

(75) Inventor: Sourav Roy, Kolkata (IN)

(73) Assignee: Freescale Semiconductor, Inc., Austin, TX (US)

( * ) Notice: Subject to any disclaimer, the term of this patent is extended or adjusted under 35 U.S.C. 154(b) by 706 days.

(21) Appl. No.: 11/752,938

(22) Filed: May 24, 2007

(65) Prior Publication Data

US 2008/0291745 A1 Nov. 27, 2008

(51) Int. Cl.
*G11C 16/04* (2006.01)
(52) U.S. Cl. .......................... 365/189.05; 365/189.02; 365/230.02; 365/230.06
(58) Field of Classification Search ............ 365/189.05, 365/189.02, 230.02, 230.06, 230.03
See application file for complete search history.

(56) References Cited

U.S. PATENT DOCUMENTS

| | | | |
|---|---|---|---|
| 6,822,976 B1 | 11/2004 | Riesenman et al. | |
| 6,914,450 B2 | 7/2005 | Chu et al. | |
| 7,095,658 B2 * | 8/2006 | Cioaca | 365/189.05 |
| 7,184,322 B2 * | 2/2007 | Takahashi et al. | 365/189.02 |

* cited by examiner

*Primary Examiner*—David Lam
(74) *Attorney, Agent, or Firm*—Charles Bergere

(57) ABSTRACT

A method and system for simultaneously reading data from multiple indexed arrays, where each indexed array includes one or more memory locations and is coupled to a multiplexing circuit. Each multiplexing circuit includes one or more multiplexers and is driven by a set of input selector signals. The method includes enabling each multiplexing circuit with a distinct combination of the set of input selector signals. The distinct combinations of the set of input selector signals cause each input selector signal to drive a comparable number of multiplexers. Each multiplexing circuit selects a memory location from the coupled indexed array. Further, the method includes reading the data at the selected memory locations through the output of each multiplexing circuit.

8 Claims, 5 Drawing Sheets

METHOD AND SYSTEM FOR SIMULTANEOUS READS OF MULTIPLE ARRAYS

BACKGROUND OF THE INVENTION

The present invention relates generally to integrated circuits, and more specifically, to a method and system for simultaneously reading data from a plurality of indexed arrays.

An Integrated Circuit (IC) is a collection of a plurality of electronic circuits that are connected together on a miniature semiconductor chip. Some examples of ICs are microprocessors, microcontrollers, digital memory chips, and the like. Miniaturization results in enhanced performance of the ICs, since small and closely packed circuits consume less power. Further, these circuits have a faster speed due to shorter paths traced by the circuit connections. Typically, speedier circuits are desirable in memory, to execute instructions at a higher speed, resulting in a faster computational rate.

Generally, memory is organized in the form of memory arrays. Typically, circuits for memory access are designed, based on the array structure of memory. The arrays constituting a memory have indexed memory locations that can store data. Typically, circuits for memory access are multiplexing circuits. These multiplexing circuits can selectively access an indexed memory location, based on a value, over a selector line. Simultaneously accessing memory locations from multiple arrays can result in faster memory access.

Currently, there exist one or more methods for simultaneously accessing memory locations from multiple arrays. One such method uses selector lines to select and access a particular memory location. These selector lines are driven by buffer elements, which improve the strength of the signals on the selector lines. The signals on the selector lines drive the multiplexing circuits, which are arranged hierarchically in one or more levels. Each level comprises one or more multiplexers. An output is selected at each level of hierarchy of the multiplexers, based on the signal value of the input selector signals.

Due to the selections made at each level, a higher hierarchical level has less number of inputs as compared to a lower hierarchical level. This results in the use of fewer multiplexers at the higher hierarchical level. Further, the number of multiplexers driven by each selector line varies because each hierarchical level is driven by a different selector line. Due to this arrangement, selector lines that drive a greater number of multiplexers have a larger critical path. This increases the time taken to access the memory. Further, the number of buffer elements required to drive the selector lines at each hierarchical level also varies, resulting in a large chip area being occupied by the buffer elements.

Therefore, in light of the above, it is desirable to reduce the memory access time and decrease the chip area. Consequently, there is a need for a method and system that enables simultaneous reading of data from multiple arrays in comparatively reduced time. Further, the method and system should also utilize less chip area as compared to existing methods.

BRIEF DESCRIPTION OF THE DRAWINGS

The following detailed description of the preferred embodiments of the present invention will be better understood when read in conjunction with the appended drawings. The present invention is illustrated by way of example, and not limited by the accompanying figures, in which like references indicate similar elements.

DETAILED DESCRIPTION OF THE PRESENT INVENTION

Figure 1:
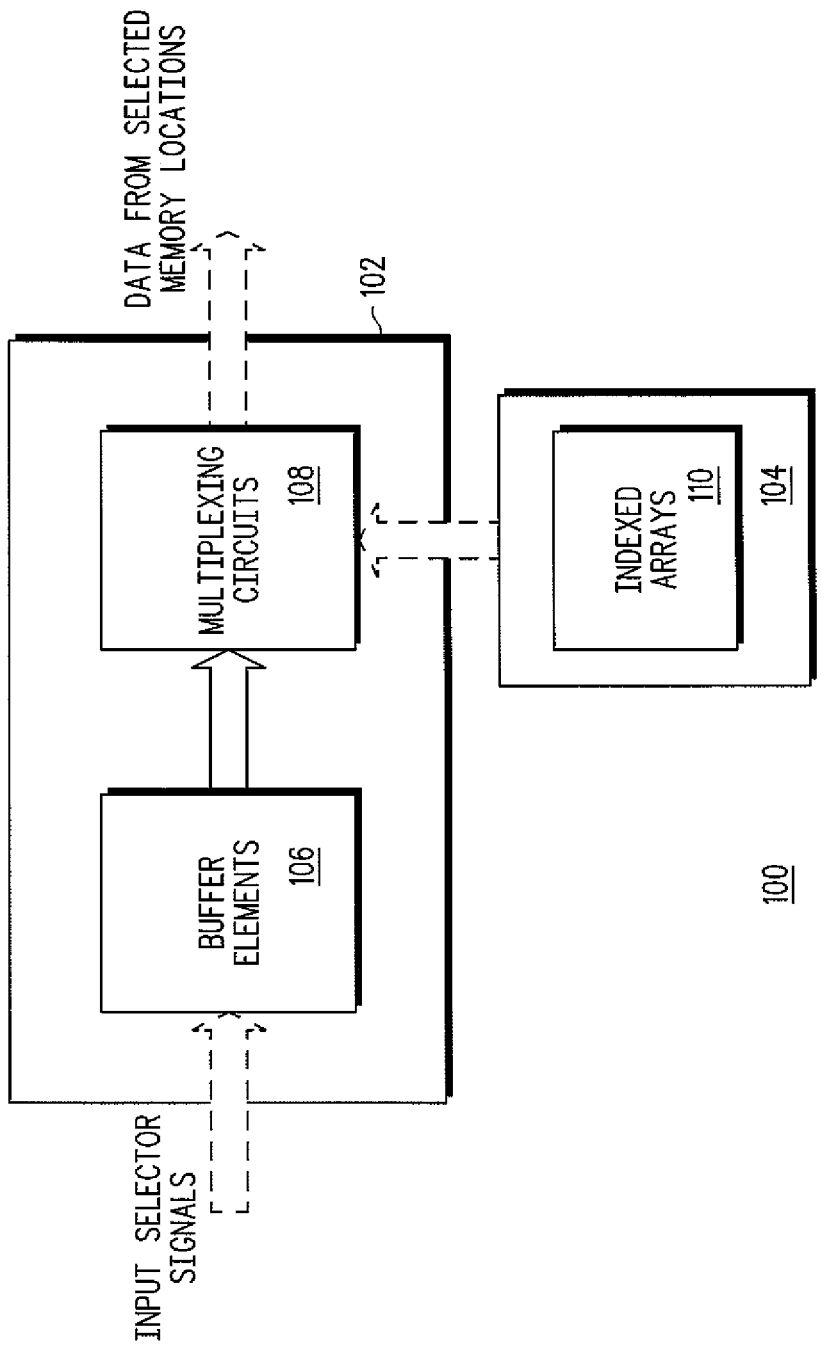
FIG. 1 is a schematic block diagram of a memory accessing system, in accordance with an embodiment of the present invention.

The detailed description, in connection with the appended drawings, is intended as a description of the presently preferred embodiments of the present invention, and is not intended to represent the only form in which the present invention may be practiced. It is to be understood that the same or equivalent functions may be accomplished by different embodiments that are intended to be encompassed within the spirit and scope of the present invention.

In an embodiment of the present invention, a method for simultaneously reading data from a plurality of indexed arrays is provided. Each indexed array of the plurality of indexed arrays includes one or more memory locations. Each indexed array is coupled to a multiplexing circuit that includes one or more multiplexers. Each multiplexing circuit is driven by a set of input selector signals. The method includes enabling each multiplexing circuit with a distinct combination of the set of input selector signals. Each multiplexing circuit selects a memory location from the corresponding coupled indexed array. The method also includes reading the data at the selected memory locations through the output of each multiplexing circuit. In one embodiment, each multiplexing circuit selects the same index from the coupled indexed arrays, corresponding to the set of input selector signals.

In another embodiment of the present invention, a memory accessing circuit is provided. The memory accessing circuit includes a plurality of buffer elements that drive a set of input selector signals. The buffer elements from thee plurality of buffer elements are organized in a pre-defined manner among the set of input selector signals. The memory accessing circuit also includes one or more multiplexing circuits that are driven by the set of input selector signals. Each multiplexing circuit is connected to one or more memory locations of an indexed array from a plurality of indexed arrays.

The one or more memory locations of the plurality of indexed arrays are used to store data. The data is selected from the one or more memory locations, based on distinct combinations of the set of input selector signals.

Embodiments of the present invention provide a method and system for simultaneously reading data from a plurality of indexed arrays. The present invention utilizes distinct combinations of a set of input selector signals to enable/drive a plurality of multiplexing circuits. The distinct combinations of the set of input selector signals cause each input selector signal to drive a comparable number of multiplexers. This can result in a reduction in the fan-out of a worst-hit input selector signal of the set of input selector signals. The fan-out of the worst hit input selector signal is distributed uniformly among the set of input selector signals. The reduction in the fan-out further reduces the timing delay from each input selector signal to the multiplexing circuits. The balancing of the fan-out also results in a reduction in the capacitive load on each of the input selector signals and reduced utilization of buffer elements for the set of input selector signals. As a result of the decrease in the number of buffer elements being used, the multiplexing circuits occupy a reduced chip area.

Referring now to FIG. 1, a schematic blocks diagram of a memory accessing system 100 is shown, in accordance with an embodiment of the present invention. The memory accessing system 100 comprises a memory accessing circuit 102 and a memory 104. Examples of the memory 104 include, but are not limited to, Read-Only memory (ROM), flash memory, Electronically Erasable Programmable Read Only Memory (EEPROM), cache memory, and the like. The memory accessing circuit 102 includes a plurality of buffer elements 106 and one or more multiplexing circuits 108. Each multiplexing circuit includes one or more multiplexers. Examples of the one or more multiplexers include, but are not limited to, 2-to-1 multiplexers, 4-to-1 multiplexers, 2-to-4 decoders, 3-to-8 decoders, and the like. The memory 104 includes a plurality of indexed arrays 110. Each indexed array of the plurality of indexed arrays 110 includes one or more memory locations. Each indexed array is coupled to a multiplexing circuit of the one or more multiplexing circuits 108. The one or more multiplexing circuits 108 are driven by a set of input selector signals. The set of input selector signals pass through the plurality of buffer elements 106 before being fed to the multiplexing circuits 108. The buffer elements in the plurality of buffer elements 106 are required to improve the strength of the input selector signals. The multiplexing circuits 108 select the one or more memory locations from the plurality of indexed arrays 110 that are read simultaneously as output. These one or more memory locations are selected, based on the values of the set of input selector signals.

In an embodiment of the present invention, the one or more multiplexers in each multiplexing circuit are arranged hierarchically into multiple levels. Each hierarchical level derives its input from the output of a lower hierarchical level. Each multiplexing circuit is enabled by a distinct combination of the set of input selector signals, which are input to the hierarchical levels of each multiplexing circuit. Each multiplexing circuit selects the one or more memory locations from the plurality of indexed arrays 110. The one or more memory locations are selected, depending on the value of the set of input selector signals. The selected memory locations are read at the output of the corresponding multiplexing circuits that are coupled to the plurality of indexed arrays 110. In one embodiment of the invention, each multiplexing circuit 108 selects the same index from the coupled indexed arrays 110, corresponding to the set of input selector signals.

Figures 2A, 2B:
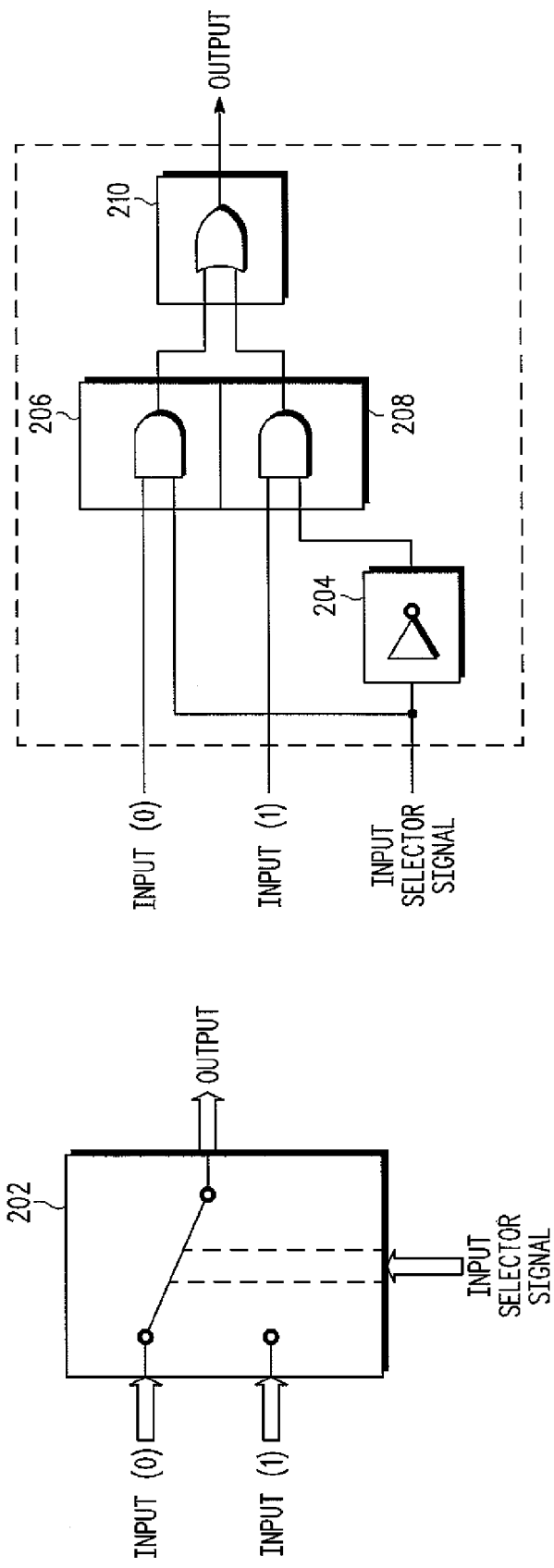
FIGS. 2A and 2B are schematic block diagrams of a multiplexer in accordance with an embodiment of the present invention.

Referring now to FIGS. 2A and 2B, a block diagram of a multiplexer is shown, in accordance with an embodiment of the present invention. FIG. 2A shows a multiplexer 202, in accordance with an embodiment of the present invention. The multiplexer 202 is shown to include two input signals, Input (0) and Input(1). Further, the multiplexer 202 is shown to include an input selector signal. The multiplexer 202 provides an output, based on the value of the input selector signal. The selection of the output is based on the design of the multiplexer 202. For an embodiment, a logic level 1 on the input selector signal can select Input(1) as the output signal, and a logic level 0 on the input selector signal can select Input(0) as the output signal.

FIG. 2B is a logic gate-level diagram of a multiplexer, in accordance with an embodiment of the present invention. The multiplexer, as depicted in FIG. 2B, includes a NOT gate 204, an AND gate 206, an AND gate 208, and an OR gate 210. The multiplexer in FIG. 2B is also shown to include an Input(0) signal, an Input(1) signal, and a input-selector signal. As shown in FIG. 2B; the Input(0) signal is selected as the output when the input selector signal is at logic level 1, and the Input(1) signal is selected as the output when the input selector signal is at logic level 0. For example, when the Input(0) signal is at logic level 0, the Input(1) signal is at logic level 1; when the input selector signal is at logic level 0, logic level 1 at the Input(1) signal is selected as the output of the multiplexer. When logic level 0 of the input selector signal passes through the NOT gate 204, a logic level 1 is obtained. A logic level 1 from the NOT gate 204 and a logic level 1 from the Input(1) signal, input to the AND gate 208, gives logic level 1 as the output of the AND gate 208. The logic level 0 from the input selector signal and the logic level 0 from the Input(0) signal, input to the AND gate 206, gives logic level 0 as the output of the AND gate 206. When the logic level 0, input from the AND gate 206, and the logic level 1, input from the AND gate 208, are input to the OR gate 210, the output obtained is logic level 1. The logic level 1 obtained from the OR gate 210 is the output of the multiplexer.

Figure 3:
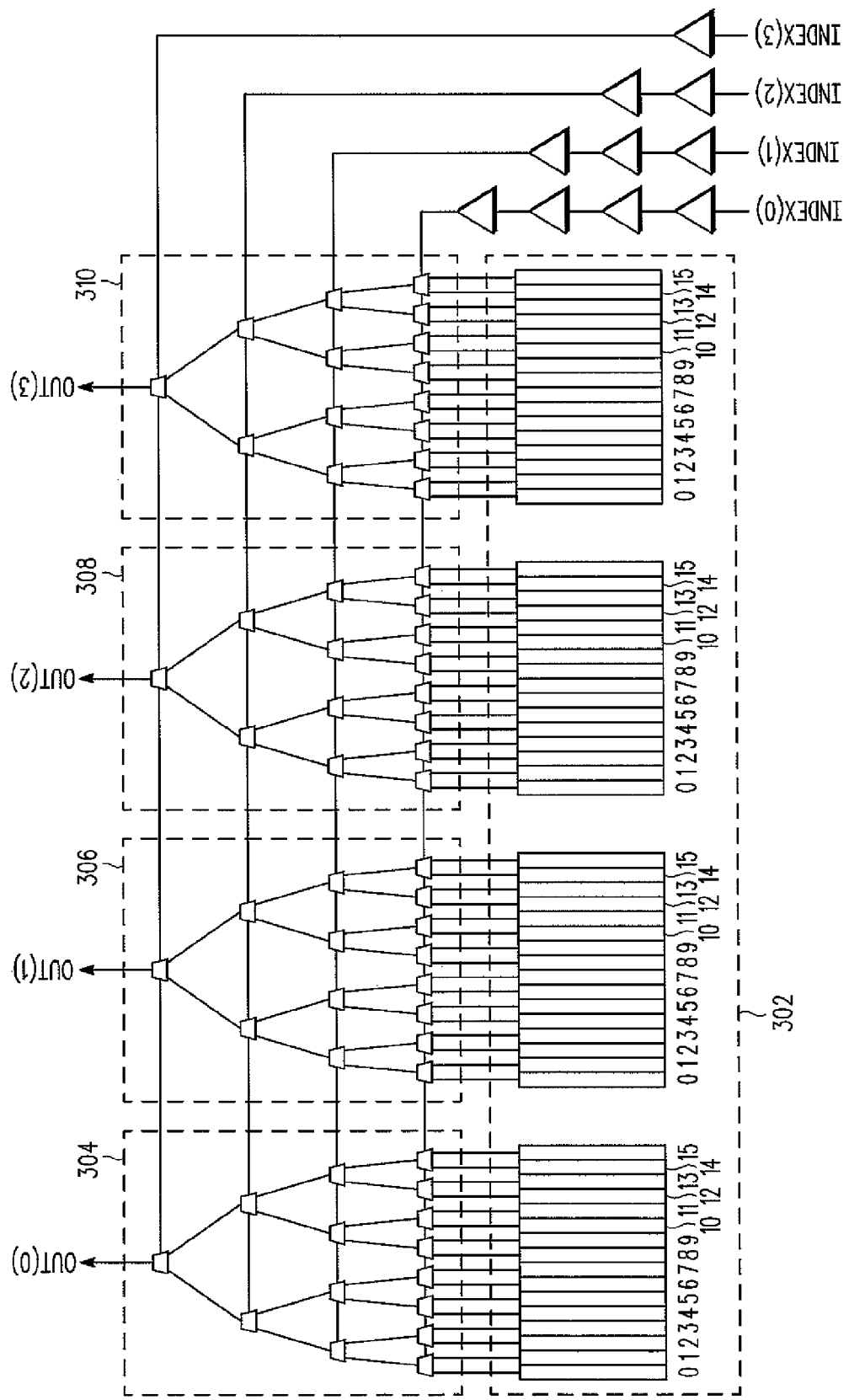
FIG. 3 is a schematic block diagram illustrating a memory accessing circuit used in prior art.

Referring now to FIG. 3, a schematic block diagram illustrating a memory accessing circuit used in prior art is shown. The memory accessing circuit shown in FIG. 3 includes a plurality of indexed arrays 302, a multiplexing circuit 304, a multiplexing circuit 306, a multiplexing circuit 308, and a multiplexing circuit 310. Each indexed array of the plurality of indexed arrays 302 includes one or more memory locations, as shown in FIG. 3. The one or more memory locations in each indexed array can be used to store data. Typically, the indices of each indexed array are numbered. In an embodiment of the present invention, indexing starts from zero.

Each indexed array of the plurality of indexed arrays 302 is coupled to a multiplexing circuit. The multiplexing circuits 304, 306, 308 and 310 can include one or more multiplexers. Examples of the multiplexers include, but are not limited to, 2-to-1 multiplexers, 4-to-1 multiplexers, 2-to-4 decoders, 3-to-8 decoders, and the like. The one or more multiplexers can be arranged in multiple levels of hierarchy. A typical arrangement of multiplexers is shown in FIG. 3. The hierarchy of multiplexers is based on the number of indices in each indexed array of the plurality of indexed arrays 302. The number of multiplexers at each level of hierarchy depends on the number of inputs the multiplexer receives. For example, a multiplexing circuit utilizing 4-to-1 multiplexers has fewer multiplexers at each level of hierarchy, as compared to a multiplexing circuit utilizing 2-to-1 multiplexers. The levels of hierarchy in the multiplexing circuits 304, 306, 308 and 310 are driven by a set of input selector signals.

The set of input selector signals is used to select an output through each of the multiplexing circuits 304, 306, 308 and 310. The set of input selector signals include index(0), index (1), index(2) and index(3) Each selector signal from the set of input selector signals drives a particular level of hierarchy. For example, as shown in FIG. 3, the selector signal index(0) drives the lowest level of hierarchy in the multiplexing circuits 304, 306, 308 and 310; the selector signal index(1) drives the next higher level of hierarchy, and so forth. Each selector signal of the set of input selector signals drives a different number of multiplexers, based on the level of hierarchy the particular selector signal is driving. As shown in FIG. 3, the set of input selector signals is driven by buffer elements and then fed to then multiplexing circuits 304, 306, 308 and 310.

The buffer elements are used to increase the drive strength of the set of input selector signals. The number of buffer elements used for a particular input selector signal is based on the number of multiplexers the input selector signal is driving at a particular level of hierarchy. For example, as shown in FIG. 3, the input selector signal index(0) drives the lowest level of hierarchy in the multiplexing circuits 304, 306, 308 and 310. The lowest level of hierarchy is shown to have 32 multiplexers, resulting in maximum use of the buffer elements for the input selector signal index(0). The highest level of hierarchy that is driven by the input selector signal index(3) includes four multiplexers. Consequently, a minimum number of buffers is used, as shown in FIG. 3. For an embodiment, the number of buffer elements used is based on the driving capacity of the buffer elements.

The set of input selector signals can select a memory location from the one or more memory locations in each indexed array. The data at the selected memory location is read as the output from the multiplexing circuits 304, 306, 308 and 310. As shown in FIG. 3, the multiplexing circuits 304, 306, 308 and 310 provide data as output through out(0), out(1), out(2) and out(3), respectively. Although FIG. 3 is shown to include the multiplexing circuits 304, 306, 308 and 310 that are coupled to the plurality of indexed arrays 302, it will be apparent to a person ordinarily skilled in the art that there can be more multiplexing circuits, based on the number of indexed arrays.

Figure 4:
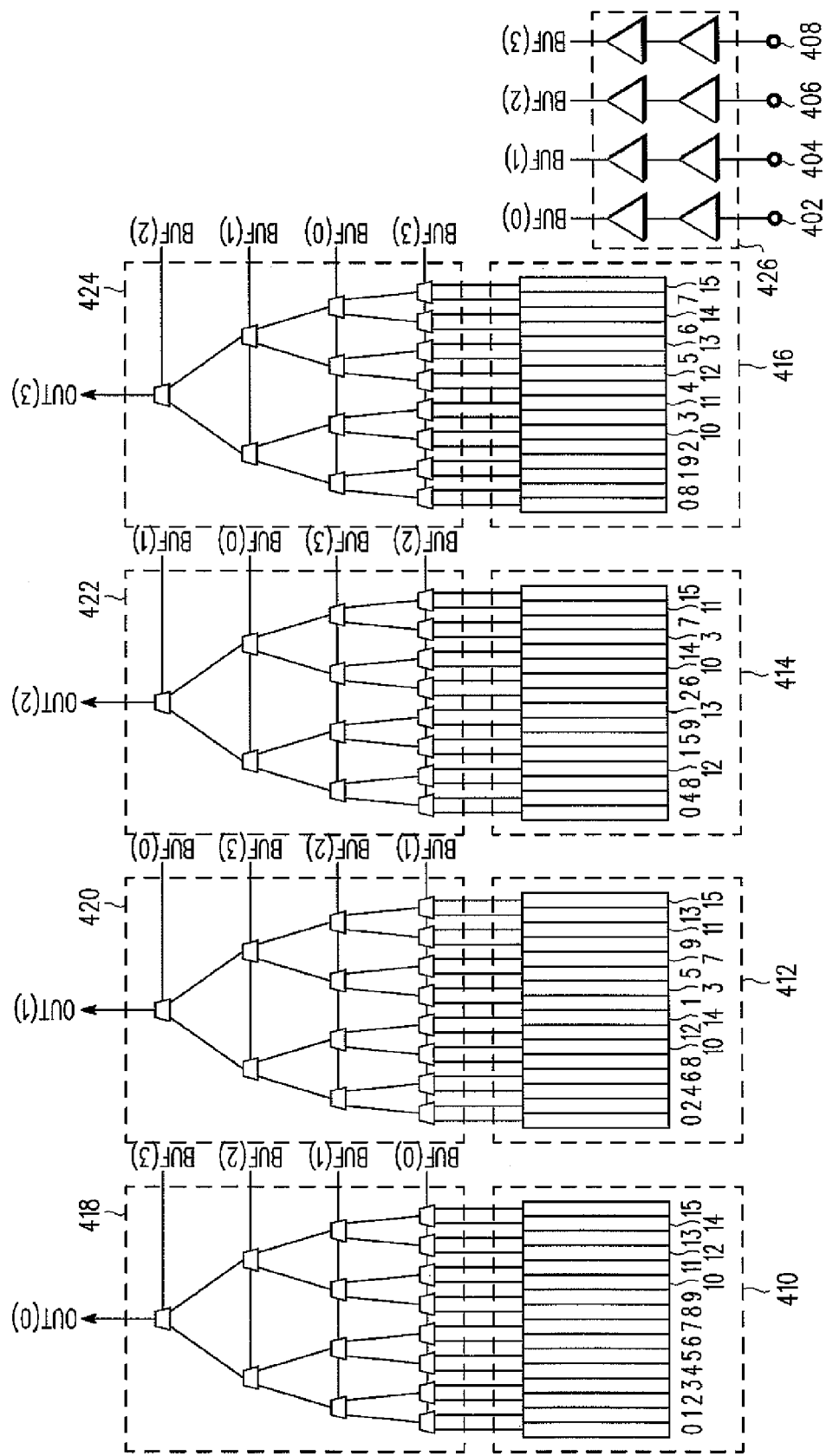
FIG. 4 is a schematic block diagram illustrating a memory accessing circuit, in accordance with an embodiment of the present invention.

Referring now to FIG. 4, a schematic block diagram illustrating a memory accessing circuit is shown, in accordance with an embodiment of the present invention. The memory accessing circuit includes a set of input selector signals 402, 404, 406 and 408; a plurality of indexed arrays 410, 412, 414 and 416; one or more-multiplexing circuits 418, 420, 422 and 424; and a plurality of buffer elements 426. The indexed arrays 410, 412, 414 and 416 include one or more memory locations. The one or more memory locations in the indexed arrays 410 through 416 can be used to store data.

The indexed arrays 410, 412, 414 and 416 are coupled to the multiplexing circuits 418, 420, 422 and 424, respectively. The multiplexing circuits 418 through 424 include one or more multiplexers that are arranged hierarchically in one or more levels. Examples of the one or more multiplexers include, but are not limited to, 2-to-1 multiplexers, 4-to-1 multiplexers, 3-to-8 decoders, and the like. In an embodiment of the present invention, the number of levels of hierarchy in the multiplexing circuits 418 through 424 is based on the number of indices in the indexed arrays 410 through 416. In another embodiment of the present invention, the number of levels of hierarchy in the multiplexing circuits 418 through 424 is based on the number of inputs the one or more multiplexers in the multiplexing circuits 418 through 424 are configured to receive. For example, a multiplexing circuit utilizing 4-to-1 multiplexers has fewer multiplexers at each level of hierarchy, as compared to a multiplexing circuit utilizing 2-to-1 multiplexers. The levels of hierarchy in the multiplexing circuits 418 through 424 are driven by a set of input selector signals buf(0), buf(1), buf(2) and buf(3). The set of input selector signals 402, 404, 406 and 408 pass through the plurality of buffer elements 426 prior to driving the multiplexing circuits.

In an embodiment of the present invention, the plurality of buffer elements 426 are utilized to increase the strength of the set of input selector signals 402 through 408 to drive the levels of hierarchy of the multiplexing circuits 418 through 424. The buffer elements are distributed in a pre-defined manner among the set of input selector signals 402 through 408, to drive the multiplexing circuits 418 through 424. In an embodiment of the present invention, the buffer elements can be distributed equally among each input selector signal in a pre-defined manner. The use of an equal number of buffer elements causes a reduction in the fan-out of the worst-hit input selector signal index(0), as described in conjunction with FIG. 3. The input selector signal 402 corresponds to the input selector signal index(0) of FIG. 3, and so forth. The fan-out of the input selector signal 402 can be distributed uniformly among the set of input selector signals 402 through 408. This reduction in the fan-out further reduces the timing delay from each input selector signal to the multiplexing circuits. The balancing of the fan-out also results in a reduction in the capacitive load on each of the input selector signals. Further, balancing the fan-out reduces the number of buffer elements used for the set of input selector signals. Reduced utilization of the buffer elements results in a proportionately smaller area being occupied by the multiplexing circuits on a semiconductor chip. A distinct combination of the set of input selector signals buf(0), buf(1), buf(2) and buf(3) can be applied to each multiplexing circuit of the multiplexing circuits 418 through 424, as shown in FIG. 4.

In an embodiment of the present invention, distinct combinations of the set of input selector signals can be generated by interchanging the positions of the set of input selector signals buf(0), buf(1), buf(2) and buf(3) for each of the multiplexing circuits 418 through 424. For example, distinct combinations of the set of input selector signals buf(O), buf(1), buf(2) and buf(3) can be obtained by arranging the set of input selector signals buf(0), buf(1), buf(2) and buf(3) in a round-robin manner to each of the multiplexing circuits 418 through 424, as shown in FIG. 4. Distinct combinations of the set of input selector signals buf(0), buf(1), buf(2) and buf(3) require rearrangement of the indexing of the one or memory locations of the indexed arrays 410 through 416. The indexing of the one or more memory locations may change, based on a particular combination of the set of input selector signals buf(0), buf(1), buf(2) and buf(3) that is applied to a corresponding multiplexing circuit. For example, as depicted in FIG. 4, indexing of the indexed array 412 is rearranged, as shown, based on the distinct combination of the set of input selector signals buf(0), buf(1), buf(2) and buf(3).

In an embodiment of the present invention, indexing of the one or more memory locations starts from zero, as shown in FIG. 3. Thereafter, input connections to each of the multiplexing circuits 418 through 424 from the plurality of indexed arrays 410 through 416 can be rearranged. The input connections are rearranged to account for the change caused by the use of the distinct combination of the set of input selector signals buf(0), buf(1), buf(2) and buf(3).

The set of input selector signals buf(0), buf(1), buf(2) and buf(3) can select a memory location from the one or more memory locations in each indexed array. Data at the selected memory location is read as the output from the multiplexing circuits 418 through 424. As shown in FIG. 4, the multiplexing circuits 418 through 424 have output signals out(0), out(1), out(2) and out(3), respectively, to read the output. Although FIG. 4 is shown to include the multiplexing circuits 418 through 424 that are coupled to the indexed arrays 410 through 416, it will be apparent to a person ordinarily skilled in the art that there can be more number of multiplexing circuits, based on the number of indexed arrays.

Figure 5:
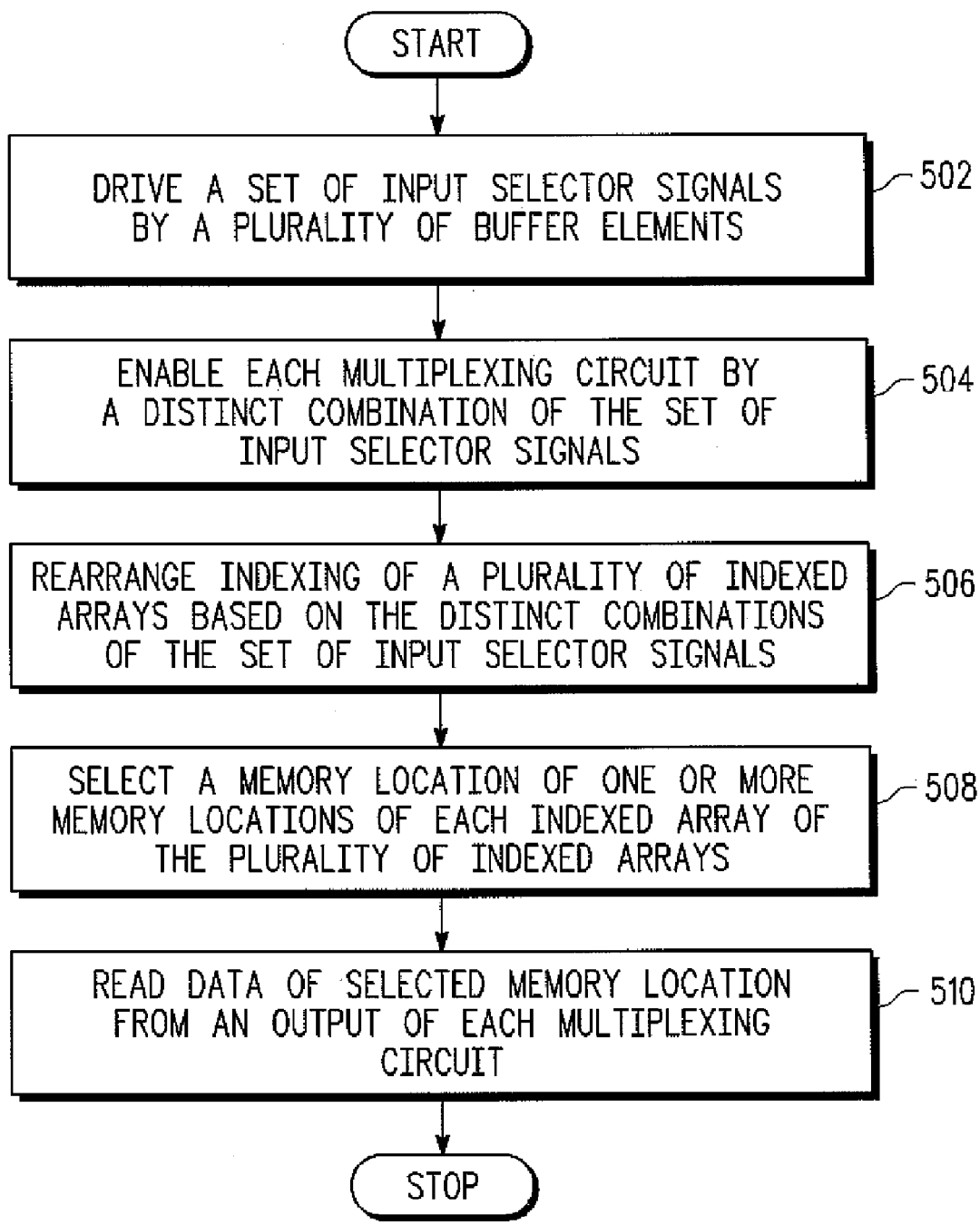
FIG. 5 is a flowchart depicting a method for simultaneously reading a plurality of indexed arrays, accordance with an embodiment of the present invention.

Referring now to FIG. 5, a flowchart depicting a method for simultaneously reading a plurality of indexed arrays, in accordance with an embodiment of the present invention is shown. For the purpose of description of FIG. 5, references will be made to the FIGS. 3 and 4. Each of the plurality of indexed arrays includes one or more memory locations. Each indexed array of the plurality of indexed arrays is coupled to a multiplexing circuit. Examples of the plurality of indexed arrays include 410, 412, 414 and 416, which are connected to the multiplexing circuits 418 through 424, as shown in FIG. 4. Each multiplexing circuit includes one or more multiplexers.

Each multiplexing circuit is driven by a set of input selector signals such as 402 through 408, as shown in FIG. 4. In an embodiment of the present invention, the cardinality of the set of input selector signals depends on the number of one or more memory locations in each indexed array of the plurality of indexed arrays. After the method for simultaneously reading a plurality of indexed arrays is initiated, the set of input selector signals are driven by a plurality of buffer elements 426 at step 502. In an embodiment of the present invention, the plurality of buffer elements 426 are distributed equally among the set of input selector signals 402 through 408 (as shown in FIG. 4). The plurality of buffer elements 426 are distributed in a manner that balances the fan-out requirement of the worst-hit input selector signal. The distribution of the plurality of buffer elements 426 causes each input selector signal from the set of input selector signals 402 through 408 to enable a comparable number of multiplexers, thereby reducing the load on the worst,hit input selector signal.

At step 504 each multiplexing circuit is enabled with a distinct combination of the set of input selector signals. A typical example has been described in conjunction with FIG. 4, where the multiplexing circuits 418 through 424 are enabled by different combinations of the set of input selector signals 402 through 408. The distinct combinations of the set of input selector signals 402 through 408 are generated by interchanging the positions of the set of input selector signals 402 through 408.

At step 506, indexing of the plurality of indexed arrays is rearranged, based on the distinct combinations of the set of input selector signals. For example, as shown in FIG. 4, the multiplexing circuit 418 that is coupled with the indexed array 410 is enabled with a particular combination of the set of input selector signals 402 through 408, which results in specific indexing of the one or more memory locations. On the other hand, the multiplexing circuit 424, coupled with the indexed array 416, is enabled with a different combination of the set of input selector signals 402 through 408, which results in indexing the one or more memory locations differently At step 508, a memory location of the one or more memory locations of each indexed array of the plurality of indexed arrays is selected. The selection of memory locations from the one or more memory locations of the plurality of indexed arrays is based on distinct combinations of the set of input selector signals applied to each multiplexing circuit. For example, if logic level 1001 is applied to the set of input selector signals 402 through 408, respectively, data at the ninth memory location is selected from the indexed array 410, data at the $12^{th}$ memory location is selected from the indexed array 412, data at the sixth memory location is selected from the indexed array 414, and data at the third memory location is selected from the indexed array 416.

At step 510, data at the selected memory location is read through the output of each multiplexing circuit. For example, data is read through the outputs (out(0), out(1), out(2) and out(3)) of the multiplexing circuits 418 through 424. Thereafter, the method for simultaneously reading a plurality of indexed arrays is terminated.

While various embodiments of the present invention have been illustrated and described, it will be clear that the present invention is not limited to these embodiments only. Numerous modifications, changes, variations, substitutions and equivalents will be apparent to those skilled in the art, without departing from the spirit and scope of the present invention, as described in the claims.

The invention claimed is:

1. A method for simultaneously reading data from a plurality of indexed arrays, each of the plurality of indexed arrays comprising one or more memory locations, each indexed array of the plurality of indexed arrays being coupled to a multiplexing circuit, each multiplexing circuit comprising one or more multiplexers, each multiplexing circuit being driven by a set of input selector signals, the method comprising:

enabling each multiplexing circuit with a distinct combination of the set of input selector signals, wherein each multiplexing circuit selects a memory location from the coupled indexed array; and reading the data at the selected memory locations through an output of each multiplexing circuit, wherein the distinct combinations of the set of input selector signals are generated by interchanging positions of the set of input selector signals for each indexed array of the plurality of indexed arrays.

2. The method for simultaneously reading data from the plurality of indexed arrays of claim 1, wherein each input selector signal of the set of input selector signals drives an equal number of multiplexers from the one or more multiplexers.

3. The method for simultaneously reading data from the plurality of indexed arrays of claim 2, further comprising driving the set of input selector signals with a plurality of buffer elements, wherein the plurality of buffer elements are distributed equally among the set of input selector signals.

4. The method for simultaneously reading data from the plurality of indexed arrays of claim 1, further comprising selecting a memory location of the one or more memory locations of each indexed array of the plurality of indexed arrays based on the distinct combinations of the set of input selector signals applied to each multiplexing circuit.

5. The method for simultaneously reading data from the plurality of indexed arrays of claim 1, wherein cardinality of the set of input selector signals is based on the number of the one or more memory locations in each indexed array of the plurality of indexed arrays.

6. The method for simultaneously reading data from the plurality of indexed arrays of claim 1, further comprising rearranging the indexing of the plurality of indexed arrays based on the distinct combinations of the set of input selector signals.

7. A memory accessing circuit, comprising:

a plurality of buffer elements that drive a set of input selector signals, wherein the buffer elements are distributed in a pre-defined manner among the set of input selector signals; and one or more multiplexing circuits driven by the set of input selector signals, wherein each multiplexing circuit is connected to one or more memory locations of an indexed array from a plurality of indexed arrays, wherein the one or more memory locations of the plurality of indexed arrays are used for storing data, wherein the data is selected from the one or more memory locations based on distinct combinations of the set of input selector signals, and wherein indexing of the one or more memory locations of each indexed array of the plurality of indexed arrays is rearranged based on the combinations of the set of input selector signals.

8. The memory accessing circuit of claim 7, wherein the pre-defined manner comprises organizing the buffer elements equally among the set of input selector signals.

* * * * *